US007507618B2

(12) United States Patent
Dunbar

(10) Patent No.: US 7,507,618 B2
(45) Date of Patent: Mar. 24, 2009

(54) METHOD FOR MAKING ELECTRONIC DEVICES USING METAL OXIDE NANOPARTICLES

(75) Inventor: Timothy D. Dunbar, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 247 days.

(21) Appl. No.: 11/167,800

(22) Filed: Jun. 27, 2005

(65) Prior Publication Data

US 2006/0292777 A1    Dec. 28, 2006

(51) Int. Cl.
*H01L 21/336* (2006.01)
*C03B 8/00* (2006.01)

(52) U.S. Cl. .................. 438/197; 438/231; 438/233; 438/698; 977/811; 65/17.2; 65/17.3; 65/60.5

(58) Field of Classification Search .............. 438/197, 438/231, 233, 698, 722; 65/17.2, 17.3, 60.5, 65/173; 977/811, 715; 56/60.5
See application file for complete search history.

(56) References Cited

U.S. PATENT DOCUMENTS

| 5,496,788 | A | * | 3/1996 | Domesle et al. .............. 502/333 |
| 5,534,445 | A | * | 7/1996 | Tran et al. ................... 438/162 |
| 5,817,160 | A | * | 10/1998 | Nagpal et al. ................ 65/17.3 |
| 5,989,738 | A | | 11/1999 | Haase et al. |
| 6,294,401 | B1 | | 9/2001 | Jacobson et al. |
| 6,342,313 | B1 | * | 1/2002 | White et al. ................. 428/701 |
| 6,737,364 | B2 | * | 5/2004 | Black et al. ................. 438/778 |
| 6,774,036 | B2 | * | 8/2004 | Goldstein .................... 438/660 |
| 6,897,164 | B2 | | 5/2005 | Baude et al. |
| 6,929,970 | B2 | * | 8/2005 | Andriessen et al. ........... 438/57 |
| 7,220,936 | B2 | * | 5/2007 | Ott et al. ................. 219/121.54 |
| 2003/0124259 | A1 | | 7/2003 | Kodas et al. |
| 2003/0180451 | A1 | | 9/2003 | Kodas et al. |
| 2004/0046168 | A1 | * | 3/2004 | Andriessen .................. 257/43 |
| 2004/0222412 | A1 | | 11/2004 | Bai et al. |
| 2005/0001210 | A1 | * | 1/2005 | Lee et al. ...................... 257/40 |
| 2005/0126338 | A1 | * | 6/2005 | Yadav .......................... 75/255 |
| 2005/0263903 | A1 | * | 12/2005 | Forbes et al. ................. 257/763 |
| 2005/0279986 | A1 | | 12/2005 | Punsalan et al. |
| 2006/0189113 | A1 | * | 8/2006 | Vanheusden et al. ........ 438/597 |
| 2006/0243321 | A1 | | 11/2006 | Yamada et al. |
| 2007/0140951 | A1 | * | 6/2007 | O'Brien et al. .......... 423/592.1 |
| 2007/0215960 | A1 | * | 9/2007 | Zhu et al. ................... 257/414 |

FOREIGN PATENT DOCUMENTS

JP        2001-244464        7/2001

OTHER PUBLICATIONS

Ishizaki et al., "Incorporation of Boron in ZnO Film From an Aqueous Solution Containing Zinc Nitrate and Dimethylamine-Borane by Electrochemical Reaction", Thin Solid Films, (2002), pp. 65-68, vol. 411, Elsevier Science B. V.

Exarhos et al., "Influence of Processing Variables on the Structure and Properties of ZnO Films", Thin Solid Films, (1995), pp. 27-32, vol. 270, Elsevier Science S. A.

Major et al., "Optical and Electronic Properties of Zinc Oxide Films Prepared by Spray Pyrolysis", Thin Solid Films, Electronics and Optics, (1985), pp. 179-185, vol. 125, Elsevier Sequoia.

Petrou et al., "The Use of ZnO in Transparent Type MIS Solar Cells", Applied Physics Letters, (Dec. 15, 1979), pp. 930-931, vol. 35, No. 12, American Institute of Physics.

Carcia et al., "Transparent ZnO Thin-Film Transistor Fabricated by Rf Magnetron Sputtering", Applied Physics Letters, (Feb. 17, 2003), pp. 1117-1119, vol. 82, No. 7, American Institute of Physics.

Monge et al., "Room-Temperature Organometallic Synthesis of Soluble and Crystalline ZnO Nanoparticles of Controlled Size and Shape", Angewandte Chemie Int. Ed., (2003), pp. 5321-5324, vol. 42, Wiley-VCH Verlag GmbH & Co. KGaA, Weinheim.

Vayssieres, "Growth of Arrayed Nanorods and Nanowires of ZnO from Aqueous Solutions", Advanced Materials, (Mar. 4, 2003), pp. 464-466, vol. 15, No. 5, Wiley-VCH Verlag GmbH & Co. KGaA, Weinheim.

Park et al., "ZnO Nanoneedles Grown Vertically on Si Substrates by Non-Catalytic Vapor-Phase Epitaxy", Advanced Materials, (Dec. 17, 2002), pp. 1841-1843, vol. 14, No. 24, Wiley-VCH Verlag GmbH & Co. KGaA, Weinheim.

Soulantica et al., "Synthesis of Indium and Indium Oxide Nanoparticles from Indium Cyclopentadienyl Precursor and Their Application for Gas Sensing", Advanced Functional Materials, (Jul. 2003), pp. 553-557, vol. 13, No. 7, Wiley-VCH Verlag GmbH & Co. KGaA, Weinheim.

Yang et al., "Controlled Growth of ZnO Nanowires and Their Optical Properties", Advanced Functional Materials, (May 2002), pp. 323-331, vol. 12, No. 5, Wiley-VCH Verlag GmbH, D-69469 Weinheim.

Nayral et al., "Synthesis of Tin and Tin Oxide Nanoparticles of Low Size Dispersity for Application in Gas Sensing", Chem. Eur. J. (2000), pp. 4082-4090, vol. 6, No. 22, Wiley-VCH Verlag GmbH, D-69451 Weinheim.

Noack et al., "Annealing of Nanometer-Sized Zinc Oxide Particles", Chemical Materials, (2002), pp. 1411-1417, vol. 14, American Chemical Society.

Shim et al., "Organic-Capped ZnO Nanocrystals: Synthesis and n-Type Character", Journal of American Chemical Society, (2001), pp. 11651-11654, vol. 123, American Chemical Society.

Norris et al., "Spin-Coated Zinc Oxide Transparent Transistors", Journal of Physics D: Applied Physics, Institute of Physics Publishing, (2003), pp. L105-L107, vol. 36, IOP Publishing Ltd.

Rataboul et al., "Synthesis and Characterization of Monodisperse Zinc and Zinc Oxide Nanoparticles from the Organometallic Precursor [Zn(C$_6$H$_{11}$)$_2$]", Journal of Organometallic Chemistry, (2002), pp. 307-312, vol. 643-644, Elsevier Science B. V.

(Continued)

*Primary Examiner*—Long K Tran
(74) *Attorney, Agent, or Firm*—Harold C. Knecht, III

(57) ABSTRACT

A method of making a thin film transistor comprises (a) solution depositing a dispersion comprising semiconducting metal oxide nanoparticles onto a substrate, (b) sintering the nanoparticles to form a semiconductor layer, and (c) optionally subjecting the resulting semiconductor layer to post-deposition processing.

28 Claims, No Drawings

OTHER PUBLICATIONS

Izaki et al., "Characterization of Boron-Incorporated Zinc Oxide Film Chemically Prepared from an Aqueous Solution", Journal of the Electrochemical Society, (2003), pp. 210-213, vol. 147, No. 1, The Electrochemical Society, Inc.

Masuda et al., "Transparent Thin Film Transistors Using ZnO as an Active Channel Layer and their Electrical Properties", Journal of Applied Physics, (Feb. 1, 2003), pp. 1624-1630, vol. 93, No. 3, American Institute of Physics.

Tang et al., "An Organometallic Synthesis of $TiO_2$ Nanoparticles", Nano Letters, (2005), pp. 543-548, vol. 5, No. 3, American Chemical Society.

Domansky et al., "Localized Deposition of Zinc Oxide Films by Automated Fluid Dispensing Method", Materials Science & Engineering B76, (2000), pp. 116-121, Elsevier Science S. A.

Carnes et al., "Synthesis, Isolation, and Chemical Reactivity Studies of Nanocrystalline Zinc Oxide", Langmuir, (2000), pp. 3764-3772, vol. 16, No. 8, American Chemical Society.

Ohya et al., "Thin Film Transistor of ZnO Fabricated by Chemical Solution Deposition", Japanese Journal of Applied Physics, (Jan. 2001), pp. 297-298, Part 1, vol. 40, No. 1, The Japan Society of Applied Physics.

Tabuchi et al., "Control of Carrier Concentration in Thin Cuprous Oxide $Cu_2O$ Films by Atomic Hydrogen", Japanese Journal of Applied Physics, (2002), pp. 5060-5063, Part 1, vol. 41, No. 8, The Japan Society of Applied Physics.

Ridley et al., "All-Inorganic Field Effect Transistors Fabricated by Printing", Science, (Oct. 22, 1999), pp. 746-749, vol. 286.

Flinn, editor, "Engineering, Chemistry, and Use of Plasma Reactors", 112, (1971), vol. 67, American Institute of Chemical Engineers.

Ott et al., "The Pulse Thermal Processing of Nanocrystalline Silicon Thin-Films", JOM, (Oct. 2004), pp. 45-47, vol. 56.

Roth et al., "Semiconducting Zinc Oxide Films Prepared by Metal Organic Chemical Vapor Deposition from Diethy Zinc", Journal of the Electrochemical Society: Solid-State Science and Technology, (Dec. 1981), pp. 2684-2686, vol. 128, No. 12.

Tagawa et al., "Atomic Oxygen Generators for Surface Studies in Low Earth Orbit", AIAA Journal, (Jan. 1994), pp. 95-100, vol. 32, No. 1.

Sze, "Physics of Semiconductor Devices", (1981), p. 442, $2^{nd}$ Edition, John Wiley & Sons, New York.

Pacholski et al., "Self-Assembly of ZnO: From Nanodots to Nanorods", Angewandte Chemie Int. Ed., (2002), pp. 1188-1191, vol. 41, No. 7, Wiley-VCH Verlag GmbH, 69451 Weinheim, Germany.

Bulthaup et al., "All-Additive Fabrication of Inorganic Logic Elements by Liquid Embossing", Applied Physics Letters, (Sep. 3, 2001), pp. 1525-1527, vol. 79, No. 10, American Institute of Physics.

Volkman et al., "A Novel Transparent Air-Stable Printable N-Type Semiconductor Technology Using ZnO Nanoparticles", IEEE, (2004), pp. 32.1.1-32.1.4.

* cited by examiner

METHOD FOR MAKING ELECTRONIC DEVICES USING METAL OXIDE NANOPARTICLES

FIELD

This invention relates to methods of making electronic devices using metal oxide nanoparticles.

BACKGROUND

Organic semiconductors can be processed at relatively low temperatures, and are thus compatible with temperature sensitive substrates such as, for example, plastic substrates. Organic electronic devices (for example, organic thin film transistors (TFTs)) have therefore gained attention as a technology with the potential to enable a variety of applications centered around lightweight, flexible, low-cost electronics fabricated on plastic substrates.

The performance of organic TFTs, however, is typically inferior to that of inorganic TFTs such as, for example, silicon-based TFTs. In addition, organic semiconductors can be degraded when they are exposed to certain environments (for example, solvents during solution processing). Some organic semiconductor materials can even be unstable in normal atmospheric conditions.

Nanoparticles of inorganic semiconducting materials can be delivered using organic solvents, and once they are sintered, they are typically impervious to solvents. Additional TFT layers can therefore be solution processed on top of the sintered inorganic layer.

SUMMARY

In view of the foregoing, we recognize that there is a need for a relatively low temperature method of making stable inorganic electronic devices.

Briefly, in one aspect, the present invention provides a method of making an electronic device comprising the steps of (a) solution depositing a dispersion comprising metal oxide nanoparticles onto a substrate, and (b) exposing the nanoparticles to light or oxidation treatment, or a combination thereof to form a device layer.

In another aspect, the invention provides a method of making a TFT comprising the steps of (a) solution depositing a dispersion comprising semiconducting metal oxide nanoparticles onto a substrate, (b) sintering the nanoparticles to form a semiconductor layer, and (c) optionally subjecting the resulting semiconductor layer to post-deposition processing. As used herein, "sintering" means agglomerating nanoparticles at temperatures below their melting point.

In still another aspect, the invention provides electronic devices and TFTs made using the methods of the invention.

The methods of the invention allow for the fabrication of metal oxide-based electronic devices and TFTs at relatively low temperatures. The methods of the invention therefore enable the construction of electronic devices and TFTs on temperature sensitive substrates such as plastics.

Semiconductor layers made from nanoparticles can be relatively unstable or air-sensitive (see, for example, U.S. Pat. No. 6,294,401 (Jacobson et al.) and Ridley et al., Science, 286, 746 (1999) wherein semiconductor layers made from cadmium selenide nanoparticles had to be fabricated in an inert atmosphere glove box).

Metal oxide nanoparticles used in the methods of the invention, however, can be dispersed in water or organic solvents, often with the aid of organic ligands or polymers. This allows the metal oxide nanoparticles to be delivered to a substrate by solution deposition. Unlike semiconductor nanoparticles of other materials (for example, silicon, germanium, and cadmium selenide), metal oxide nanoparticles have the additional advantage of being stable to oxidation. This stability enables processing of the metal oxide nanoparticles in a variety of oxidizing condition such as, for example, air, ozone, atomic oxygen, or oxygen plasma. Such oxidizing conditions can efficiently remove organic ligands, if used, from the metal oxide surface at relatively low temperatures. Sintering of the nanoparticles can also take place at relatively low temperatures.

Thus, the methods of the invention meet the need in the art for a relatively low temperature method of making stable inorganic electronic devices.

DETAILED DESCRIPTION

Method of Making an Electronic Device

The methods of the invention can be used for making electronic devices such as, for example, capacitors, transistors (for example, junction transistors or thin film transistors), diodes (for example, light emitting diodes), photovoltaics, sensors, solar cells, and displays.

A method of the invention for making electronic devices involves solution depositing a dispersion comprising metal oxide nanoparticles onto a substrate, and then exposing the nanoparticles to light or oxidation treatment, or a combination thereof to form a device layer. The device layer can be any layer of a device in which semiconducting or conducting properties could be useful. The device layer can be, for example, a semiconductor layer, an electrode layer, a conductive trace, an electron transporting layer, a hole transporting layer, a light emitting layer, or the like. Preferably, the device layer is a semiconductor layer or an electrode layer.

The device layer is formed from metal oxide nanoparticles (that is, metal oxide particles having at least two dimensions in the 0.1 to 100 nm range). Suitable metal oxides include binary, ternary, and quaternary metal oxide compounds. Useful binary metal oxides include, for example, $ZnO$, $SnO_2$, $In_2O_3$, $CdO$, $TiO_2$, $Ga_2O_3$, $Cu_2O$, $Ag_2O$, $BeO$, $NiO$, and the like. Useful ternary metal oxides include, for example, $AgInO_2$, $AgSbO_3$, $Cd_2GeO_4$, $CdIn_2O_4$, $Cd_2Sb_2O_7$, $CdSnO_3$, $Cd_2SnO_4$, $CuAlO_2$, $CuInO_2$, $CuGaO_2$, $In_4Sn_3O_{12}$, $MgIn_2O_4$, $SrCu_2O_2$, $ZnGa_2O_4$, $Zn_2In_2O_5$, $Zn_3In_2O_6$, $ZnSnO_3$, $Zn_2SnO_4$, and the like. Useful quaternary metal oxides include, for example, $InGaMgO_4$, $InGaZnO_4$, and the like.

As is known in the art, the alignment or structural order of the above metal oxide compounds can differ for each polymorph or crystallographic phase, and this structural order determines the electronic properties of the device layer. The crystallographic phase adopted by the compounds can depend, for example, on the process and conditions under which the layers are formed. Internal defects can also be controlled, for example, by post-deposition processing. Therefore, metal oxide materials can be semiconducting or conducting depending upon how they are processed or doped.

The device layer can also be formed from nanoparticles of normally insulating materials that have been doped to make them into semiconducting or conducting materials. For example, zirconium oxide ($ZrO_2$), which is an insulator in its pure and relatively defect free state, can be doped with significant amounts (for example, 10-30%) of $In_2O_3$ to make it into a semiconducting or conducting material. Alkaline metal titanates (for example, $SrTiO_3$, $BaTiO_3$, and $CaTiO_3$) can also be made semiconducting by doping with atoms such as Nb.

When a semiconducting layer is desired, it is preferred that the nanoparticles comprise a metal oxide having a Hall mobility greater than about 1 cm$^2$ V$^{-1}$ s$^{-1}$ (more preferably, greater than about 10 cm$^2$ V$^{-1}$ s$^{-1}$; most preferably, greater than about 50 cm$^2$ V$^{-1}$ s$^{-1}$) as estimated by the van der Pauw method when measured as a single crystal or thin film. When a conducting layer is desired, it is preferred that the nanoparticles comprise a metal oxide having a resistivity less than about 10$^{-2}$ Ω-cm (more preferably less than about 10$^{-3}$ Ω-cm).

Preferably, the device layer is formed from nanoparticles comprising zinc oxide or tin oxide, or a combination thereof; more preferably, the device layer is formed from nanoparticles comprising zinc oxide. For some applications, it is preferable that the device layer be transparent.

Some metal oxide nanoparticles such as zinc oxide and tin oxide nanoparticles are commercially available. Metal oxide nanoparticles can be synthesized using various chemical methods (see, for example, Vayssieres, Adv. Mater. 15, 464 (2003); Pacholski et al., Angew. Chem. 114, 1234 (2002); Carnes et al., Langmuir 16, 3764 (2000); and Shim et al., J. Am. Chem. Soc. 123, 11651 (2001)) or physical methods (see, for example, Yang et al., Adv. Funct. Mater. 12, 323 (2002); and Park et al., Adv. Mater. 14, 1841 (2002)).

Preferably, the metal oxide nanoparticles are synthesized using an organometallic precursor method. Metal oxide nanoparticles can be synthesized, for example, by first forming metal nanoparticles through decomposition of an organometallic precursor and then oxidizing the as-formed nanoparticles (see, for example, Nayral et al., Chem. Eur. J. 6, 4082 (2000) for the preparation of tin oxide nanoparticles; Soulantica et al., Adv. Funct. Mater. 13, 553 (2003) for the preparation of indium oxide nanoparticles; and Rataboul et al. J. Organomet. Chem. 643-644, 311 (2002) for the preparation of zinc oxide nanoparticles from $Zn(c-C_6H_{11})_2$). When the organometallic precursor is air-sensitive and decomposes in air, it is preferable that the metal oxide nanoparticles are synthesized by controlled oxidation of the precursor in solution (see, for example, Monge et al., Angew. Chem. Int. 42, 5321 (2003) wherein zinc oxide nanoparticles are formed by allowing a mixture of $Zn(c-C_6H_{11})_2$, ligands, and tetrahydrofuran to slowly evaporate at room temperature; and Tang et al., Nano Lett. 543-548, 5 (2005) wherein titanium oxide nanoparticles are formed by reacting bis-(cyclooctatetraene) titanium with dimethyl sulfoxide and ligands in organic solution at room temperature).

The metal oxide nanoparticles have at least two dimensions in the nanoscale (that is, in the 0.1 to 100 nm range). Preferably, the nanoparticles are less than 50 nm in at least one dimension; more preferably, less than about 10 nm. They can have various shapes (for example, spherical, rod-shaped, or nanowire) and be of varying sizes. In some applications, it can be preferable to use a combination of shapes and/or sizes. For example, in some applications, it can be advantageous to have a bimodal or multimodal distribution of nanoparticles sizes so the nanoparticles can "pack" more tightly when they are deposited.

The metal oxide nanoparticles can be dispersed in a solvent and solution deposited onto a substrate. Any solvent in which the nanoparticles are dispersible and that is compatible with the chosen solution deposition process can be used. Optionally, the dispersion can comprise small amounts of additives such as, for example, surfactants. The dispersion generally comprises from less than about 1% to greater than about 90% nanoparticles by weight. As is known by one of skill in the art, the ideal concentration will vary depending upon the chosen solution deposition method.

The dispersion can be deposited onto a substrate using any solution deposition technique. For example, the dispersion can be deposited by spin coating, dip coating, meniscus coating, gravure coating, or printing techniques such as ink jet printing, flexographic printing, and the like. Preferably, the dispersion is deposited by spin coating or a printing technique.

The substrate can be the substrate that supports the entire electronic device ("device substrate") or another layer or feature of the device.

After the dispersion of metal oxide nanoparticles is deposited onto the substrate, the solvent can be evaporated, preferably using heat. Useful layer thicknesses are generally between about 5 nm and about 100 nm. Preferably, the resulting layer thickness is between about 15 nm and about 60 nm. As is known by one of skill in the art, the optimum layer thickness can vary, however, depending upon the type of device layer being formed and the end use of the electronic device. If the resulting layer is not thick enough, an additional solution deposition can be performed.

The dried nanoparticle layer can then be exposed to light (for example, ultraviolet (UV), visible, or infrared light) or oxidation treatment, or a combination thereof. The light and/or oxidation treatment fuses, or agglomerates, the nanoparticles to form a device layer.

In general, a wavelength of light that is strongly absorbed by the metal oxide should be used. Preferably, the wavelength of light is more energetic than the band gap energy of the metal oxide. Therefore, for most metal oxides, UV light is preferable. However, for some metal oxides such as, for example, $Cu_2O$, visible light is sufficient.

UV light can be supplied, for example, by an excimer laser, a UV florescent light ("black light"), a germicidal light, or a 254 nm low pressure mercury arc lamp. Preferably, the dried nanoparticles layer is exposed to light and ozone. UV/ozone can be supplied, for example, by a 185 nm low pressure mercury arc lamp.

Oxidation treatment can be carried out, for example, using ozone treatment, exposure to atomic oxygen, or oxygen plasma. Atomic oxygen and negatively charged oxygen ions can be generated as a consequence of oxygen plasma generation, or they can be generated through methods known in the art (see, for example, Tagawa et al., AIAA Journal 32, 95 (1994)). Oxygen plasma can be generated by a variety of means known in the art (see, for example, Finn, *Engineering, Chemistry, and Use of Plasma Reactors*, American Institute of Chemical Engineers, New York, 1971).

The metal oxide layer can be patterned, for example, using ink jet printing or masking techniques. To pattern using masking techniques, a metal oxide layer can be deposited as described above. Then, the layer can be patterned by exposing predetermined regions of the layer to UV light through a photomask, which permits the light to pass only in accordance with the desired pattern. Only the regions that are exposed to the light will sinter. The unsintered regions can then be removed (for example, with solvents).

Multiple device layers made using the method of the invention can be used within the same electronic device. For example, a doped metal oxide layer made using the method of the invention can be used as the transparent electrode in a photovoltaic device. A semiconducting layer comprising a metal oxide that is not transparent in at least a portion of the visible spectrum (for example, $Cu_2O$) made using the method of the invention can be used as the semiconductor layer in the same photovoltaic device.

The remaining features and layers of the electronic device can be fabricated using any useful methods.

Device layers made using the method of the invention appear to be more porous than layers of the same materials made by other methods. The method of the invention can therefore be particularly useful for making sensing layers for sensors such as, for example, target gas sensors.

Method of Making a Thin Film Transistor

Thin film transistors (TFTs) are a particularly useful type of electronic device. TFTs generally include a transistor substrate, a gate electrode on the transistor substrate, a gate dielectric on the gate electrode, a source and a drain electrode adjacent to the gate dielectric, and a semiconductor layer adjacent to the gate dielectric and adjacent to the source and drain electrodes. These components can be assembled in a variety of configurations. For example, the source and drain electrodes can be adjacent to the gate dielectric with the semiconductor layer over the source and drain electrodes, or the semiconductor layer can be interposed between the source and drain electrodes and the gate dielectric.

The present invention provides a method of making TFTs. The method involves solution depositing a dispersion comprising semiconducting metal oxide nanoparticles onto a substrate, and sintering the nanoparticles to form a semiconductor layer.

TFTs made according to the present invention can be provided on a substrate ("transistor substrate"). The transistor substrate typically supports the TFT during manufacturing, testing, and/or use. For example, one transistor substrate may be selected for testing or screening various embodiments while another transistor substrate is selected for commercial embodiments. Optionally, the transistor substrate can provide an electrical function for the TFT. Useful transistor substrate materials include organic and inorganic materials. For example, the transistor substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly (ethylene terephthalate) (PET), poly(phenylene sulfide) (PPS)), filled polymeric materials (for example, fiber-reinforced plastics (FRP)), fibrous materials, such as paper and textiles, and coated or uncoated metallic foils. Preferably, the transistor substrate comprises a polymeric material.

A flexible transistor substrate can be used with the present invention. A flexible transistor substrate allows for roll processing, which may be continuous, providing economy of scale and economy of manufacturing over flat and/or rigid substrates. The flexible transistor substrate chosen preferably is capable of wrapping around the circumference of a cylinder of less than about 50 cm diameter (preferably, less than about 25 cm diameter; more preferably, less than about 10; most preferably, less than about 5 cm) without distorting or breaking. The force used to wrap the flexible transistor substrate of the invention around a particular cylinder typically is low, such as by unassisted hand (that is, without the aid of levers, machines, hydraulics, and the like). The preferred flexible transistor substrate can be rolled upon itself.

The gate electrode of a TFT can be any useful conductive material. For example, the gate electrode can comprise doped silicon, or a metal, such as aluminum, copper, chromium, gold, silver, nickel, palladium, platinum, tantalum, and titanium, and transparent conducting oxides such as indium tin oxide or a doped zinc oxide (for example, aluminum doped zinc oxide or gallium doped zinc oxide).

Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some TFTs, the same material can provide the gate electrode function and also provide the support function of a transistor substrate. For example, doped silicon can function as the gate electrode and support the TFT.

The gate dielectric electrically insulates the gate electrode from the balance of the TFT device. The gate dielectric preferably has a relative dielectric constant above about 2 (more preferably, above about 5). The dielectric constant of the gate dielectric can be relatively high, for example, 80 to 100 or higher. Useful materials for the gate dielectric can comprise, for example, organic or inorganic electrically insulating materials.

Specific examples of organic materials useful for the gate dielectric include polymeric materials, such as polyvinylidenefluoride (PVDF), cyanocelluloses, polyimides, epoxies, and the like. Other useful organic materials are described in copending application U.S. Ser. No. 10/434,377, filed on May 8, 2003.

Specific examples of inorganic materials useful for the gate dielectric include strontiates, tantalates, titanates, zirconates, aluminum oxides, silicon oxides, tantalum oxides, titanium oxides, silicon nitrides, barium titanate, barium strontium titanate, and barium zirconate titanate. In addition, alloys, combinations, and multilayers of these materials can be used for the gate dielectric.

The source electrode and drain electrodes of a TFT are separated from the gate electrode by the gate dielectric, while the semiconductor layer can be over or under the source electrode and drain electrode. The source and drain electrodes can be any useful conductive material. Useful materials include most of those materials described above for the gate electrode, for example, aluminum, barium, calcium, chromium, copper, gold, silver, nickel, palladium, platinum, titanium, transparent conducting oxides such as indium tin oxide or a doped zinc oxide (for example, aluminum doped zinc oxide or gallium doped zinc oxide), polyaniline, PEDOT: PSS, other conducting polymers, alloys thereof, combinations thereof, and multilayers thereof.

The thin film electrodes (that is, the gate electrode, source electrode, and drain electrode) can be provided by any useful means such as, for example, by plating, ink jet printing, or vapor deposition (for example, thermal evaporation or sputtering). Patterning of the thin film electrodes can be accomplished by known methods such as aperture masking, additive photolithography, subtractive photolithography, printing, microcontact printing, and pattern coating. The gate dielectric can be provided by any useful means such as, for example vapor deposition or plasma-based deposition.

The semiconductor layer of a TFT made according to the method of the invention is formed from semiconducting metal oxide nanoparticles (that is, semiconducting metal oxide particles having at least two dimensions in the 0.1 to 100 nm range). Preferably, the nanoparticles are less than 50 nm in at least one dimension; more preferably, less than about 10 nm.

Suitable semiconducting metal oxides include, for example, the binary, ternary, and quaternary metal oxide compounds listed above.

The semiconductor layer can also be formed from nanoparticles of normally insulating materials that have been doped to make them into semiconducting materials. For example, zirconium oxide ($ZrO_2$), which is an insulator in its pure and relatively defect free state, can be doped with $In_2O_3$ to make it into a semiconducting material. Alkaline metal titanates (for example, $SrTiO_3$, $BaTiO_3$, and $CaTiO_3$) can also be made semiconducting by doping with atoms such as Nb.

Preferably, the nanoparticles comprise a metal oxide having a Hall mobility greater than about 1 $cm^2$ $V^{-1}$ $s^{-1}$ (more preferably, greater than about 10 $cm^2$ $V^{-1}$ $s^{-1}$; most preferably, greater than about 50 $cm^2$ $V^{-1}$ $s^{-1}$) as estimated by the van der Pauw method when measured as a single crystal or thin film.

Preferably, the semiconductor layer is formed from nanoparticles comprising zinc oxide or tin oxide, or a combination thereof; more preferably, the semiconductor layer is formed from nanoparticles comprising zinc oxide.

Preferably, the metal oxide nanoparticles are synthesized using an organometallic precursor method as discussed above.

The semiconducting metal oxide nanoparticles can have various shapes (for example, spherical, rod-shaped, or nanowire) and be of varying sizes. Sometimes it can be preferable to use a combination of shapes and/or sizes. For example, it can sometimes be advantageous to have a bimodal or multimodal distribution of nanoparticles sizes so the nanoparticles can "pack" more tightly when they are deposited.

The metal oxide nanoparticles can be dispersed in a solvent and solution deposited onto a substrate. The dispersion can be deposited onto the substrate using any solution deposition technique. For example, the dispersion can be deposited by spin coating, dip coating, meniscus coating, gravure coating, or printing techniques such as ink jet printing, flexographic printing, and the like. Preferably, the dispersion is deposited by spin coating or a printing technique.

The "substrate" onto which the semiconductor layer is deposited can be the transistor substrate or another layer or feature of the transistor. For example, in some TFT constructions the semiconductor layer is deposited onto the gate dielectric (that is, the gate dielectric is the "substrate"), and the source and drain electrodes are deposited onto the semiconductor layer. In other constructions, the source and drain electrodes are deposited onto the gate dielectric, and the semiconductor layer is deposited onto the gate dielectric and source and drain electrodes (that is, the gate dielectric and source and drain electrodes are the "substrate"). The substrate could also be an optional TFT layer such as, for example, a sealing layer or a surface treatment layer.

Optionally, after the dispersion of metal oxide nanoparticles is deposited onto the substrate, the solvent can be evaporated, preferably using heat. Typically, the resulting layer thickness can be between about 5 nm and about 100 nm (preferably, between about 15 nm and about 60 nm). As is known by one of skill in the art, the optimum layer thickness can vary, however, depending upon the type of device layer being formed and the end use of the electronic device. If the resulting layer is not thick enough, an additional solution deposition can be performed.

The nanoparticle layer can then be sintered. Sintering can be accomplished using any method that agglomerates the nanoparticles at temperatures below their melting point. Sintering can be accomplished, for example, using heat, light (for example, UV, visible, or infrared light), or oxidation treatment (for example, ozone treatment, exposure to atomic oxygen, or oxygen plasma), or a combination thereof (for example, UV/ozone treatment or pulse thermal processing).

Sintering by heat can be accomplished, for example, using an oven. When using heat, sintering is typically accomplished at a temperature less than about $\frac{2}{3}$ of the melting point of the metal oxide. Preferably, sintering is accomplished at a temperature less than about 300° C.; more preferably, less than about 150° C.

When using light for sintering, a wavelength of light that is strongly absorbed by the metal oxide should be used. Preferably, the wavelength of light is more energetic than the band gap energy of the metal oxide. For most metal oxides, preferably the light is UV light.

Atomic oxygen and negatively charged oxygen ions can be generated as a consequence of oxygen plasma generation, or they can be generated through methods known in the art (see, for example, Tagawa et al., AIAA Journal 32, 95 (1994)).

Oxygen plasma can be generated by a variety of means known in the art (see, for example, Finn, *Engineering, Chemistry, and Use of Plasma Reactors*, American Institute of Chemical Engineers, New York, 1971).

Preferably, sintering is accomplished using a combination of heat, UV light, and/or ozone treatment; most preferably, a combination of all three is used. UV/ozone can be supplied, for example, using a 185 nm low/medium pressure mercury lamp. A high-density infrared plasma arc can also be used for pulse thermal processing (see, for example, Ott et al., JOM 45-47, 56 (2004)).

Optionally, the resulting semiconductor can be subjected to post-deposition processing to improve its semiconducting properties. Some metal oxide layers such as, for example, tin oxide layers may not exhibit satisfactory semiconducting properties for use as a TFT semiconductor layer unless they are subjected to post-deposition processing. Post-deposition processing can include, for example, annealing in air, annealing in forming gas (for example, about 5% $H_2$ and about 95% nitrogen or argon or the like), treating with atomic hydrogen, or aging at ambient conditions (preferably, annealing in forming gas).

As used herein, "annealing" means heating above ambient temperature. Typically, annealing involves heating to a temperature above ambient temperature, but less than about $\frac{2}{3}$ of the melting point of the metal oxide. Preferably, annealing is accomplished at less than about 300° C.; more preferably, less than about 150° C.

Exposure to atomic hydrogen (H) can, for example, reduce the concentration of excessive oxygen atoms in a metal oxide layer. Atomic hydrogen can be generated, for example, by the catalytic reaction between $H_2$ and heated tungsten catalyst in a catalytic chemical vapor deposition apparatus (see, for example, Tabuchi et al., Jpn. J. Appl. Phys. 5060-5063, 41 (2002)).

When aging at ambient conditions, the semiconductor layer is typically aged for at least 1 day; preferably, at least 7 days.

Post-deposition processing can be performed immediately after the semiconductor layer is formed (that is, before other TFT layers or features are deposited onto the semiconductor layer) or after other TFT layers or features have been deposited onto the semiconductor layer if at least a portion of the semiconductor layer remains exposed. A second post-deposition processing can also be performed after additional TFT layers or features are deposited onto the semiconductor layer or when the TFT is complete. Preferably, the resulting (that is, completed) TFT is subjected to a second post-deposition processing if the first post-deposition processing was performed before source and drain electrodes were deposited.

Post-deposition processing can also be used to improve the performance of other device layers (for example, device layers made using the method of the invention for making an electronic device, or device layers made using other methods). Device layers can also be subjected to hydrogen plasma in order to increase conductivity.

EXAMPLES

Objects and advantages of this invention are further illustrated by the following examples, but the particular materials and amounts thereof recited in these examples, as well as other conditions and details, should not be construed to unduly limit this invention.

Test Measurements

Film Thickness

Single wavelength ellipsometry was employed to obtain estimates of polymeric layer thickness. Substrate values of Psi and Delta ($\psi_s$ and $\Delta_s$) were obtained from cleaned substrates (described below) at an angle of incidence of 50° and 70° and a wavelength of 632.8 nm using a Gaertner Dual Mode Automatic Ellipsometer, model L116A (Gaertner Co., Skokie, Ill.). A ZnO nanoparticle layer was applied to the substrates (described below), and values were measured ($\psi_f$ and $\Delta_f$).

Ellipsometry modeling software, WVASE32 (from J. A. Woollam, Inc., Lincoln, Neb.) was used to construct optical models appropriate to the specific substrate investigated. Material optical constants included with the program were used unless specified otherwise.

For thermal oxide on silicon substrates, the optical model consisted of 1000 Å of $SiO_2$ on 50 Å of an intermix layer (a Bruggeman effective medium approximation consisting of 50% $SiO_2$ and 50% Si) on top of a silicon substrate. The floating variables in the fit were the $SiO_2$ thickness and the intermix layer thickness. Typical fit values were 950-990 Å $SiO_2$, 10-60 Å intermix.

For alumina layers on silicon substrates, the optical model was 1500 Å of $Al_2O_3$ on Si. The floating variables in the fit were the thickness in Angstroms (d) and refractive index (n) of the $Al_2O_3$. Seed values of d=1500 and n=1.77 were used. Typical final fit values were between 1400 Å and 1700 Å with n between 1.56 and 1.60.

Once the substrate parameters were determined by modeling $\psi_s$ and $\Delta_s$, they were fixed and a layer was added to the optical model to represent the ZnO layer, between the air and dielectric layers. This layer had a variable thickness and variable refractive index. The WVASE32 program was used to find the values of thickness and refractive index that allowed best fit to $\psi_f$ and $\Delta_f$.

Thin Film Transistor Performance

Transistor performance was tested at room temperature in air using techniques known in the art, for example as shown in S. M. Sze, *Physics of Semiconductor Devices*, page 442, John Wiley & Sons, New York, 1981. A Semiconductor Parameter Analyzer (model 4145A from Hewlett-Packard, Palo Alto, Calif.) was used to obtain the results below.

The square root of the drain current ($I_d$) was plotted as a function of gate-source bias ($V_g$), from −10V to +40V for a constant source-drain bias ($V_d$) of +40V, and the saturation field effect mobility was calculated from the straight line portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the subthreshold slope (S). The on-off ratio was taken as the difference between the minimum and maximum drain current ($I_d$) values of the $I_d$-$V_g$ curve.

Materials

Preparatory Example A

Diisopropylzinc-Derived ZnO Nanoparticle Dots

Diisopropylzinc (2.1 mmol, 2.1 ml of a 1.0 M solution in toluene, available from Aldrich, Milwaukee, Wis.) was added to anhydrous, unstabilized tetrahydrofuran (THF, 47.5 ml, Aldrich) in an inert atmosphere glove box and stirred. Octylamine (2.1 mmol, 0.35 ml, from Aldrich) was added and the solution was stirred under inert atmosphere for 3½ hours. The solution was then removed from inert atmosphere, the jar uncapped and the THF allowed to evaporate until dry. The particles were then dispersed in 40 ml of THF through a combination of stirring and ultrasonication. This dispersion was then filtered through a syringe filter equipped with a 1 micron glass membrane (Acrodisc 4524, available from Pall Life Sciences, East Hills, N.Y.), then through a syringe filter equipped with a glass membrane (AP1502500, available from Millipore, Billerica, Mass.). The THF was then removed via a rotary evaporator. The particles were further dried on a vacuum line (20 millitorr). X-ray diffraction (XRD) and transmission electron microscopy (TEM) confirmed the presence of nanoparticles.

Preparatory Example B

Diphenylzinc-Derived ZnO Nanoparticle Dots

Diphenylzinc (2.1 mmol, 0.461g, available from Alfa Aesar, Ward Hill, Mass.) was added to anhydrous, unstabilized tetrahydrofuran (THF, 49.5 ml, Aldrich) in a glove box and stirred. Octylamine (2.1 mmol, 0.35 ml, from Aldrich) was added and the solution was stirred under inert atmosphere for 3½ hours. The solution was then removed from inert atmosphere, the jar uncapped and the THF allowed to evaporate until dry. The particles were then dispersed in 40 ml of THF through a combination of stirring and ultrasonication. This dispersion was then filtered through a syringe filter equipped with a 1 micron glass membrane (Acrodisc 4524, Pall Life Sciences). The THF was then removed via a rotary evaporator. The particles were further dried on a vacuum line (20 millitorr). XRD and TEM confirmed the presence of nanoparticles.

Preparatory Example C

Diethylzinc-Derived ZnO Nanoparticle Dots

Dietheylzinc (4.2 mmol, 4.2 ml of a 1.0 M solution in hexanes, Aldrich) was added to 100 ml anhydrous, unstabilized THF in a glove box. Octylamine (4.2 mmol, 0.69 ml, Aldrich) was added and the solution was stirred under inert atmosphere for 3½ hours. The solution was then removed from inert atmosphere, the jar uncapped and the THF allowed to evaporate until dry. The resulting particles were then dispersed in 120 ml of THF through a combination of stirring and ultrasonication. This dispersion was then filtered through a syringe filter equipped with a 1 micron glass membrane (Acrodisc 4524, Pall Life Sciences), and then filtered through a syringe filter equipped a 0.2 micron PTFE membrane (Acrodisc 4225, Pall). The THF was removed via rotary evaporation, and the sample further dried on a vacuum line (20 millitorr, 1 hour). XRD and TEM confirmed the presence of nanoparticles Preparatory Example D Diethylzinc-Derived ZnO Nanoparticle Rods Dietheylzinc (21 mmol, 21 ml of a 1.0 M solution in hexanes, Aldrich) was added to 22.5 ml anhydrous, unstabilized THF in a glove box. Octylamine (0.42 mmol, 3.47 ml, Aldrich) was added and the solution was stirred under inert atmosphere for 3 hours. The solution was then removed from inert atmosphere. The jar of solution was placed in a water bath to keep the temperature of the solution at or near room temperature. The jar was uncapped, and the THF allowed to evaporate until dry. A slurry was created by adding 50 ml of THF. A portion of the slurry created was diluted with more THF to make a ten-fold reduction in concentration. It was then filtered through a glass 1 micron glass membrane (Acrodisc 4524, Pall Life Sciences) and the concentration was further reduced by rotary evaporation to form a paste.

A portion of the paste was placed in a 50 ml round bottom flask and volatiles and octylamine was removed by Kugelrohr apparatus (70° C., 20 millitorr). The remaining particles were reslurried with 6 ml of methyl ethyl ketone (MEK), and the volatiles again removed by Kugelrohr apparatus (80° C., 20 millitorr). The MEK addition and removal by Kugelrohr was repeated a second time. Approximately 2.6 g of ZnO particles with octylamine coating remained. 38.5 ml MEK was added, and the particles were dispersed by a combination of stirring, heating to 40° C. and ultrasonication. This dispersion was then filtered through a syringe filter equipped with a 1 micron glass membrane (Acrodisc 4524, Pall Life Sciences), and then filtered through a syringe filter equipped a 0.45 micron PTFE membrane (Acrodisc 4219, Pall). XRD and TEM of dried-down samples confirmed the presence of zinc oxide nanorods, rods 34±12 nm long by 6.3±1.6 nm in diameter.

Thin Film Transistor Preparation

Substrate Preparation

Single crystal <100> orientation heavily-doped silicon wafers were obtained from Silicon Valley Microelectronics, San Jose, Calif. A 1500 Å layer of alumina (Wafer A), or a 1000 Å layer of high temperature thermal silicon oxide (Wafer B) was deposited on each wafer front via chemical vapor deposition. A 5000 Å layer of aluminum metal was deposited onto the backside of each wafer. In this demonstration, the doped wafer capped with aluminum served as the gate electrode and the aluminum oxide or silicon oxide functioned as the gate dielectric when thin film transistors were prepared.

The wafer substrates were cleaved into smaller pieces and cleaned by rinsing sequentially in heptane, then acetone, then 2-propanol and blown dry with a stream of filtered nitrogen gas. They were then further cleaned by 10 min exposure in a UV/ozone chamber.

Semiconductor Coating Procedure

The cleaned dielectric-coated silicon wafer piece was spin-coated with a dispersion of metal oxide nanoparticles. The layer was then dried by briefly heating the wafer on a hotplate. The layer thickness was then checked with ellipsometry. If it was less than 30 nm, a second spin coating and heating cycle was performed.

After the bake to drive off solvent, the layer of nanoparticles on the substrate was sintered, typically by either heating in air in a furnace, or by exposing to UV light and the ozone generated by that light, or by UV light supplied by an excimer laser. This was then followed by ellipsometry to check the layer thickness and refractive index after sintering.

Source and Drain Electrode Deposition Procedure

Source and drain electrodes were deposited by clipping a shadow mask (such as flexible polymeric shadow masks taught in U.S. Pat. No. 6,897,164 (Baude et al)) to the ZnO-coated wafer and loading it into a physical vapor deposition chamber. First, 5 nm of calcium was deposited, followed by 100 nm aluminum, as measured by quartz crystal microbalance. Device dimensions were 20 to 110 microns channel length×1000 microns channel width. Devices were then tested as above.

Post-Deposition Processing

The devices created above were sometimes subjected to post-deposition processing such as annealing in air, annealing in forming gas, or aging in ambient. They were then retested as outlined above.

EXAMPLES

For Examples 1-30 listed below, between 1 and 10 devices were fabricated. The results reported in Tables 1-6 are therefore averaged results when more than one device was fabricated and tested.

Example 1

Enough octylamine-coated diisopropylzinc-derived ZnO nanoparticle dots (from Preparatory Example A) were collected and dispersed in MEK to form a 15 mg ml$^{-1}$ dispersion. This dispersion was spin-coated onto a cleaned piece of Wafer B at 1000 rpm. It was then baked at 100° C. for 10 min on a hotplate. The wafer piece was then broken into four pieces. Each piece was heated individually in a Vulcan 3-550 (Ney, Yucaipa, Calif.) furnace at one of four temperatures (300, 500, 700 or 900° C.). The wafer piece was put in the furnace, and a 20° C. min$^{-1}$ ramp from room temperature was used to attain the specified heating temperature. The oven remained at the specified temperature for 1 hour, and then was allowed to cool to room temperature. Top contacts were deposited, the devices tested, and results reported in Table 1.

Example 2

Enough octylamine-coated diphenylzinc-derived ZnO nanoparticle dots (from Preparatory Example B) were collected and dispersed in MEK to form a 25 mg ml$^{-1}$ dispersion. This dispersion was spin-coated onto a cleaned piece of Wafer B at 2000 rpm. The wafer was put in a furnace, and a 10° C. min$^{-1}$ ramp from room temperature was used to attain the heating temperature of 300° C. The oven remained at 300° C. for 1 hour, and then was allowed to cool to room temperature. Top contacts were deposited, the devices tested, and results reported in Table 1.

Examples 3 and 4

Forming gas treatment of the complete TFT devices (from Examples 1 and 2) was accomplished by placing the wafer pieces in a glass tube inserted into the quartz tube of a tube furnace (Barnstead International, Thermolyne Model 79500, Dubuque, Iowa). Forming gas (5% H$_2$ in N$_2$) was flowed into the tube. The tube exited into a pressure controller (J-KEM Scientific, Digital Vacuum Regulator Model 200, St. Louis, Mo.), and the pressure controller exited into a vacuum pump.

The pressure controller was set to keep the pressure at 500 torr. The tube furnace was heated to 300° C. Once that temperature was attained, it was held for two hours. The furnace was then cooled to room temperature under flowing forming gas (FG). The devices were then removed.

TABLE 1

Device characteristics from sintered zinc oxide nanoparticles spin-coated onto Wafer B.

| Example | Air firing temp, °C. | Post-deposition processing | Sub-threshold slope, V/decade | On/Off ratio | Mobility, $cm^2 V^{-1} s^{-1}$ | Threshold voltage, V |
|---|---|---|---|---|---|---|
| 1 | 300 | none | 2.8 | $3 \times 10^4$ | $4 \times 10^{-5}$ | 10 |
| 3 | 300 | FG | 1.4 | $9 \times 10^5$ | $1.5 \times 10^{-3}$ | 19 |
| 2 | 300 | none | 13 | 3 | $4 \times 10^{-6}$ | −25 |
| 4 | 300 | FG | 5 | 8000 | $5 \times 10^{-5}$ | 10 |
| 1 | 500 | none | 11 | 100 | 0.08 | −43 |
| 3 | 500 | FG | 150 | 3 | 0.026 | −130 |
| 1 | 700 | none | 4.9 | 5000 | 0.4 | −19 |
| 3 | 700 | FG | 17 | 73 | 1.10 | −33 |

Example 5

Enough octylamine-coated diisopropylzinc-derived ZnO nanoparticle dots (from Preparatory Example A) were collected and dispersed in MEK to form a 15 mg ml$^{-1}$ dispersion. This dispersion was spin-coated onto a cleaned piece Wafer A at 1000 rpm. It was then baked at 100° C. for 10 min on a hotplate. This wafer piece was further broken into four pieces and fired as the wafer pieces in Example 1 were, except that a heating rate of 10° C. min$^{-1}$, was used. Results are displayed in Table 2.

Example 6

Enough octylamine-coated diphenylzinc-derived ZnO nanoparticle dots (from Preparatory Example B) were collected and dispersed in MEK to form a 25 mg ml$^{-1}$ dispersion. This dispersion was spin-coated onto a cleaned piece Wafer A at 2000 rpm. The wafer was put in the furnace, and a 10° C. min$^{-1}$ ramp from room temperature was used to attain the heating temperature of 300° C. The oven remained at 300° C. for 1 hour, and then was allowed to cool to room temperature. Top contacts were deposited, the devices tested, and results reported in Table 2.

Examples 7 and 8

The devices from Examples 5 and 6 were subjected to forming gas treatment using essentially the procedure used in Example 3.

TABLE 2

Device characteristics from sintered zinc oxide nanoparticles spin-coated onto Wafer A.

| Example | Air firing temp, °C. | Post-deposition processing | Sub-threshold slope, V/decade | On/Off ratio | Mobility, $cm^2 V^{-1} s^{-1}$ | Threshold voltage, V |
|---|---|---|---|---|---|---|
| 5 | 300 | none | 6.4 | 600 | $8 \times 10^{-7}$ | −3 |
| 7 | 300 | FG | N/A | N/A | N/A | N/A |
| 6 | 300 | none | 32 | 2.6 | $9 \times 10^{-7}$ | −31 |
| 8 | 300 | FG | 6 | 4000 | $4 \times 10^{-4}$ | −2 |
| 5 | 500 | none | 19 | 47 | $4 \times 10^{-4}$ | 0 |
| 7 | 500 | FG | 24 | 49 | $7 \times 10^{-5}$ | 3 |
| 5 | 700 | none | 39 | 6 | $2 \times 10^{-4}$ | −30 |
| 7 | 700 | FG | 50 | 19 | $5 \times 10^{-3}$ | −70 |
| 5 | 900 | none | 14 | 1000 | $2.5 \times 10^{-3}$ | 13 |
| 7 | 900 | FG | 22 | 200 | 0.025 | 1 |

Example 9

Prep for Examples 10 and 11

Enough octylamine-coated diethylzinc-derived nanoparticle dots (from Preparatory Example C) were collected and dispersed in MEK to make a 25 mg ml$^{-1}$ dispersion. This was spin-coated onto a cleaned piece of Wafer B at 2000 rpm. It was then baked for 3 min at 150° C. on a hotplate. This wafer piece was then broken to pieces to form Example 10 and Example 11.

Example 10

This wafer piece was baked at 300° C. for one hour, using a 20° C. min$^{-1}$ ramp to heat the sample and furnace. After heating, the wafer and furnace were allowed to cool to room temperature. Source and drain electrodes were deposited and the piece tested. Results are recorded in Table 3.

Example 11

This wafer piece was placed on a small lab jack in a home-built UV-ozone cleaning chamber, which employed an ozone generating grid lamp (part 88-9102-02, BHK Incorporated, Claremont, Calif.). The ozone generating grid lamp emits 185 nm and 254 nm light, and lower intensity, longer wavelengths. The intensity of the 254 nm light emission was measured using a UV Power Puck Radiometer (UV Process Supply, Chicago, Ill.). The lab jack was adjusted so that the radiometer sensor was 10 mm below the edge of the lamp reflector housing. The UV-C (250-260 nm) band dose was measured as 6.4 mW per sq. cm. The lab jack was adjusted so that the wafer piece was 10 mm from the edge of the reflector housing that holds the lamp. Oxygen was flowed into the chamber at a rate of 4.2 standard liters per minute. The wafer piece was exposed to UV light and the ozone generated therein for 30 minutes. The wafer piece was removed from the UV-O$_3$ chamber, source and drain electrodes were then deposited and the piece tested as detailed above. Results are recorded in Table 3.

Examples 12 and 13

The wafer pieces from Examples 10 and 11 were treated in forming gas as in Example 3, excepting that the tube furnace was set to 150° C. Upon cooling, the wafers were removed and tested. Results are recorded in Table 3.

TABLE 3

Device characteristics from sintered zinc oxide
nanoparticles spin-coated onto Wafer B.

| Example | Sintering method | Post-deposition processing | Sub-threshold slope, V/decade | On/Off ratio | Mobility, $cm^2 V^{-1} s^{-1}$ | Threshold voltage, V |
|---|---|---|---|---|---|---|
| 10 | 300° C. | none | 4.5 | 126 | 0.00066 | −7.6 |
| 11 | UV-ozone | none | 1.7 | 900 | 0.007 | −7 |
| 12 | 300° C. | FG | 3.0 | 3700 | 0.0006 | −3 |
| 13 | UV-ozone | FG | 3.4 | $1.3 \times 10^4$ | 0.0039 | 5 |

Examples 14-18

Two pieces of Wafer B were cleaned as above. They were then spin coated at 2000 rpm with a 25 mg ml$^{-1}$ dispersion of diethylzinc-derived nanoparticle dots (from Preparatory Example C). The wafer pieces were then heated on a hotplate for 3 minutes at 150° C. The wafer pieces were then further cleaved into smaller pieces for treatment with a UV-excimer laser system. The excimer laser system was built by Resonetics, and included an OPTex Kr:F excimer laser (manufactured by Lambda Physik). The laser supplies 248 nm light in short intense pulses. The optics of the system were adjusted so that it could deliver a pulse of 1.5 mJ cm$^{-2}$ over a 1.1 cm by 1.5 cm area. Each wafer piece was treated with either 50, 100, 1000, 10,000, or 65,535 pulses at a rate of 50 pulses per second. After treatment with the excimer laser, source and drain contacts were deposited. Initial testing revealed that none of the samples showed n-channel TFT behavior. The wafer pieces were then treated in forming gas at 150° C. for 2 hours, as in Example 12. Results are shown in Table 4.

TABLE 4

Device characteristics for UV excimer-laser
processed ZnO nanoparticle based TFTs on Wafer B.

| Example | Treatment (laser pulses) | Post-deposition processing | Sub-threshold slope, V/decade | On/Off ratio | Mobility $cm^2 V^{-1} s^{-1}$ | Threshold voltage, V |
|---|---|---|---|---|---|---|
| 14 | 50 | FG | 10.0 | 2000 | $2.0 \times 10^{-6}$ | 6 |
| 15 | 100 | FG | 19 | 12 | $9 \times 10^{-6}$ | −6 |
| 16 | 1000 | FG | 8 | 1000 | $6 \times 10^{-6}$ | 8.9 |
| 17 | 10,000 | FG | 7 | 700 | $1.8 \times 10^{-4}$ | 2.2 |
| 18 | 65,535 | FG | 6 | 61 | 0.00016 | −5.5 |

Examples 19 and 20

A piece of Wafer A and Wafer B were spin-coated with a dispersion of Kugelrohred diethylzinc-derived ZnO nanoparticle rods (from Preparatory Example D) at 500 rpm for 6 seconds, then at 2000 rpm for 60 seconds. The wafer pieces were then baked on a hotplate for 3 minutes at 150° C. The ZnO layers were then processed in the UV-ozone chamber under the same conditions as in Example 11. Source and drain electrodes were deposited and the devices tested as above. Results are in Table 5.

For the sample on Wafer B, applying scans using the typical $V_d$=40 V and −10 V<Vg<40 V yielded reverse direction I-V curves that did not return to the same off current they started with (often they were 100× or more higher in $I_d$). This indicates that device parameters measured in the forward direction will not be accurate indicators of device performance. However, the device did behave properly with only a $V_d$ of 5V. This yielded a mobility of 0.00048 cm$^2$ V$^{-1}$ s$^{-1}$.

Example 21

A small piece (containing source and drain electrodes) of the wafer used in Example 19 was broken off and aged for 7 days in a in wafer tray (Entegris H22-20-0615, Chaska, Minn.) enclosed with a wafer tray cover (Entegris H22-201-0615) in ambient atmosphere. It was then retested. Results are displayed in Table 5. Aging the device appears to have improved performance.

Example 22

The aged wafer piece from Example 21 was annealed in air on a hotplate for 30 minutes at 150° C. It was retested. Results are displayed in Table 5.

Example 23

The wafer piece from Example 22 was allowed to age one week after its 150° C. anneal. It was retested. Results are in Table 5.

Example 24

The wafer used in Example 21 was broken into several pieces, such that they all had source and drain contacts on them. One piece was annealed in air on a hotplate for 30 minutes at 150° C. It was retested. Results are displayed in Table 5.

Example 25

The wafer used in Example 24 was annealed in air on a hotplate for 30 minutes at 300° C. It was retested. Results are displayed in Table 5.

Examples 26 and 27

Small pieces of the wafer pieces used in Example 19 and Example 20 were broken off and subjected to forming gas treatment at 150° C. for 2 hours, essentially as described in Example 12. Results are reported in Table 5.

Examples 28 and 29

The samples used in Example 26 and Example 27 were allowed to age enclosed in wafer trays with covers (see Example 21) on a lab bench at ambient for 118 days after their treatment in forming gas. They were then retested. Results are reported in Table 5.

TABLE 5

Device characteristics for UV-ozone processed ZnO nanorod-based TFTs.

| Example | Wafer | Post-deposition processing | Sub-threshold slope, V/decade | On/Off ratio | Mobility, $cm^2 V^{-1} s^{-1}$ | Threshold voltage, V |
|---|---|---|---|---|---|---|
| 19 | A | none | 3.98 | 487 | 0.000484 | −2.64 |
| 20 | B | none | 2.5 | 500 | 0.0119 | −3.0 |
| 21 | A | 7 day age @ ambient | 2.6 | $2 \times 10^5$ | 0.0034 | 17 |
| 22 | A | 7 day age @ ambient, and 30 min @ 150° C. | 1.9 | $5 \times 10^5$ | 0.017 | 12 |
| 23 | A | 7 day age @ ambient, 30 min @ 150° C., and 7 day age @ ambient | 1.5 | $8 \times 10^5$ | 0.013 | 15 |
| 24 | B | 30 min @ 150° C. | 4.2 | 2900 | 0.010 | 5 |
| 25 | B | 30 min @ 150° C., and 30 min @ 300° C. | 21 | 25 | $12 \times 10^{-6}$ | 3 |
| 26 | A | FG | 8.4 | 1100 | 0.031 | 4 |
| 27 | B | FG | 7 | 3000 | 0.030 | 6 |
| 28 | A | FG and 118 day age @ ambient | 4.3 | $1.0 \times 10^4$ | 0.0147 | 9.8 |
| 29 | B | FG and 118 day age @ ambient | 4.1 | $1.6 \times 10^4$ | 0.0148 | 10.9 |

Example 30

A commercially available tin oxide sol (Nyacol SN15ES, Nyacol Nano Technologies, Inc., Ashland, Mass.) was dialyzed for 1 week against distilled water using a Spectra/Por 2 Dialysis Membrane (Spectrum Labs, Los Angeles, Calif.). After dialysis, the sol was diluted with an equal weight of water. The sol was then filtered through a 1-micron glass filter membrane (Acrodisc 4524, Pall Life Sciences).

A sample of wafer B was cleaned as above. The dialyzed tin oxide dispersion was spin coated onto the wafer at 2000 rpm. The sample was then UV-$O_3$ treated essentially as described above for 30 minutes. Ca/Al electrodes were deposited and the devices tested. No transistor behavior was observed. The wafer was then subjected to forming gas treatment at 150° C. for two hours.

TABLE 6

Device Characteristics for UV-ozone sintered $SnO_2$ nanoparticle-based TFTs on Wafer B

| Example | Post-deposition processing | Sub-threshold slope, V/decade | On/Off ratio | Mobility, $cm^2 V^{-1} s^{-1}$ | Threshold voltage, V |
|---|---|---|---|---|---|
| 30 | FG | 4 | $1 \times 10^5$ | $1.4 \times 10^{-4}$ | 8 |

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

I claim:

1. A method of making a thin film transistor comprising:
   (a) solution depositing a dispersion comprising semiconducting metal oxide nanoparticles onto a substrate;
   (b) sintering the nanoparticles at a temperature less than about 150° C. to form a semiconductor layer of a thin film transistor; and
   (c) optionally subjecting the resulting semiconductor layer to post-deposition processing;
   wherein sintering is accomplished using ultraviolet light or ozone treatment, or a combination thereof, and optionally heat.

2. The method of claim 1 wherein the nanoparticles comprise zinc oxide or tin oxide, or a combination thereof.

3. The method of claim 2 wherein the nanoparticles comprise zinc oxide.

4. The method of claim 1 wherein the nanoparticles comprise a doped insulating material.

5. The method of claim 1 wherein the nanoparticles comprise a metal oxide having a Hall mobility greater than about 1 cm$^2$ V$^{-1}$ s$^{-1}$.

6. The method of claim 5 wherein the nanoparticles comprise a metal oxide having a Hall mobility greater than about 10 cm$^2$ V$^{-1}$ s$^{-1}$.

7. The method of claim 1 wherein the nanoparticles comprise a transparent metal oxide.

8. The method of claim 1 wherein the nanoparticles are synthesized using an organometallic precursor method.

9. The method of claim 1 wherein the dispersion comprises a bimodal or multimodal size distribution of nanoparticles.

10. The method of claim 1 wherein the dispersion is deposited by spin coating or a printing technique.

11. The method of claim 1 wherein the substrate is a dielectric layer.

12. The method of claim 1 wherein the thin film transistor comprises a polymeric transistor substrate.

13. The method of claim 12 wherein the thin film transistor comprises a flexible polymeric transistor substrate.

14. The method of claim 1 wherein the resulting semiconductor layer is subjected to post-deposition processing.

15. The method of claim 14 wherein the resulting thin film transistor is subjected to a second post-deposition processing.

16. The method of claim 14 wherein the resulting thin film transistor is annealed in air, annealed in forming gas, treated with atomic hydrogen, or aged at ambient conditions.

17. The method of claim 16 wherein the resulting thin film transistor is annealed in forming gas.

18. A thin film transistor comprising a semiconductor layer made by the method of claim 1.

19. A method of making an electronic device comprising:
(a) solution depositing a dispersion comprising metal oxide nanoparticles onto a substrate; and
(b) exposing the nanoparticles to ultraviolet light or oxidation treatment, or a combination thereof at a temperature less than about 150° C. to form a device layer, wherein the device layer is a semiconductor layer or an electrode layer.

20. The method of claim 19 wherein the nanoparticles comprise zinc oxide or tin oxide, or a combination thereof.

21. The method of claim 19 wherein the nanoparticles comprise a doped insulating material.

22. The method of claim 19 wherein the nanoparticles comprise a metal oxide having a Hall mobility greater than about 1 cm$^2$ V$^{-1}$ s$^{-1}$ or a resistivity less than about 10$^{-2}$ Ω-cm.

23. The method of claim 19 wherein the nanoparticles comprise a transparent metal oxide.

24. The method of claim 19 wherein the nanoparticles are exposed to ultraviolet light to form the device layer.

25. The method of claim 19 wherein the nanoparticles are exposed to ultraviolet light and ozone to form the device layer.

26. The method of claim 19 wherein the electronic device is a sensor.

27. An electronic device comprising a semiconductor layer or an electrode layer made by the method of claim 19.

28. A method of making an electronic device comprising:
(a) solution depositing a dispersion comprising metal oxide nanoparticles onto a substrate; and
(b) exposing the nanoparticles to ultraviolet light or oxidation treatment, or a combination thereof at a temperature less than about 150° C. to form a device layer;
wherein the electronic device is a sensor.

* * * * *

UNITED STATES PATENT AND TRADEMARK OFFICE
CERTIFICATE OF CORRECTION

| | | |
|---|---|---|
| PATENT NO. | : 7,507,618 B2 | Page 1 of 1 |
| APPLICATION NO. | : 11/167800 | |
| DATED | : March 24, 2009 | |
| INVENTOR(S) | : Timothy D. Dunbar | |

It is certified that error appears in the above-identified patent and that said Letters Patent is hereby corrected as shown below:

Title Page 2 Col. 1 (Other Publications) – Line 3 - Delete "(2003)," and insert -- (2000), --, therefor.

Title Page 2 Col. 2 (Other Publications) – Line 8 - Delete "Diethy" and insert -- Diethyl --, therefor.

Column 19 – Line 10 - In Claim 8, delete "arc" and insert -- are --, therefor.

Signed and Sealed this

Tenth Day of November, 2009

David J. Kappos
*Director of the United States Patent and Trademark Office*